United States Patent [19]

Birglechner et al.

[11] 3,967,366

[45] July 6, 1976

[54] METHOD OF CONTACTING CONTACT POINTS OF A SEMICONDUCTOR BODY

[75] Inventors: Georg Birglechner, Obereisesheim; Leonard Botzenhardt, Heilbronn, both of Germany

[73] Assignee: Licentia Patent-Verwaltungs-G.m.b.H., Frankfurt am Main, Germany

[22] Filed: Mar. 22, 1974

[21] Appl. No.: 453,880

[30] Foreign Application Priority Data
Mar. 29, 1973  Germany............................ 2315711

[52] U.S. Cl.................................. 29/588; 29/576 S; 29/591; 228/180 A
[51] Int. Cl.² ........................................ B01J 17/00
[58] Field of Search ............... 29/576 S, 588, 471.1, 29/627, 591

[56] References Cited
UNITED STATES PATENTS

| | | | |
|---|---|---|---|
| 3,387,359 | 6/1968 | Dale ................................. | 29/576 S |
| 3,436,810 | 4/1969 | Kauffman ............................ | 29/588 |
| 3,544,857 | 12/1970 | Byrne ................................ | 29/576 S |
| 3,553,828 | 1/1971 | Starger .............................. | 29/576 S |
| 3,698,074 | 10/1972 | Helda................................ | 29/471.1 |
| 3,762,039 | 10/1973 | Douglass............................. | 29/588 |

*Primary Examiner*—W. Tupman
*Attorney, Agent, or Firm*—Spencer & Kaye

[57] ABSTRACT

A method of contacting contact points of a semiconductor body comprises first attaching the semicoductor body to a heat conducting portion of a first frame with inwardly directed tongues directed towards the contact points, positioning a second frame with inwardly directed tongues engaging with their ends, the contact points, the second frame also engaging the first frame, attaching the frames and semiconductor body together at the engagement points and thereafter separating each of the two frames to provide insulated leads to the contact points.

11 Claims, 5 Drawing Figures

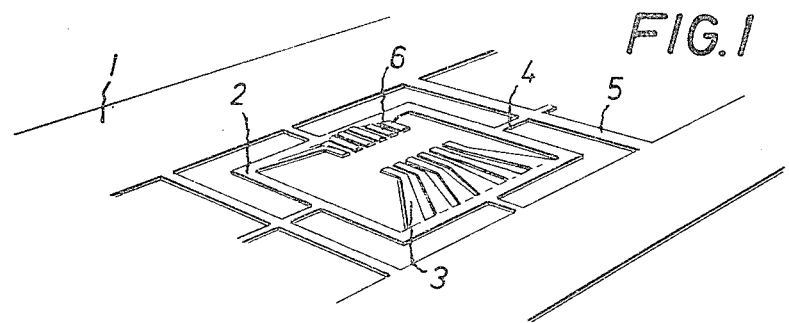
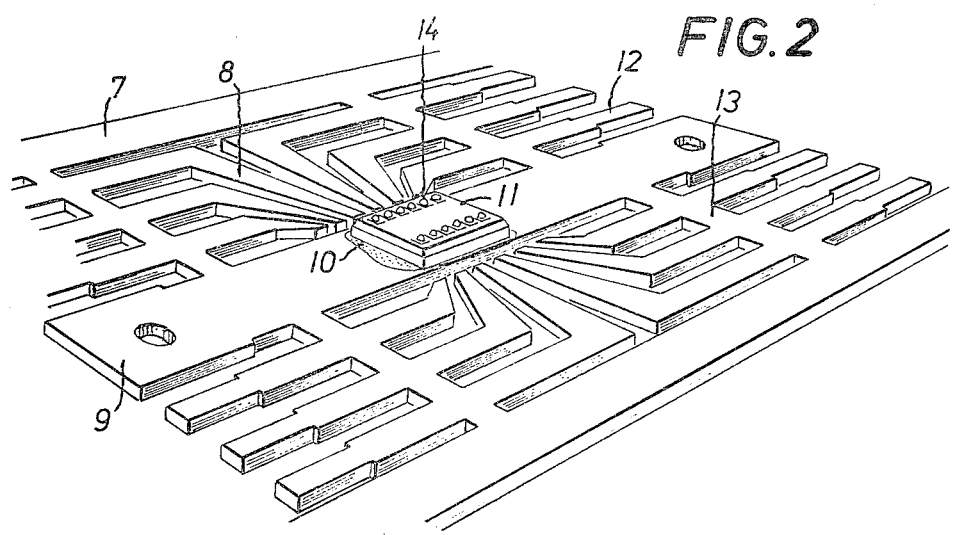
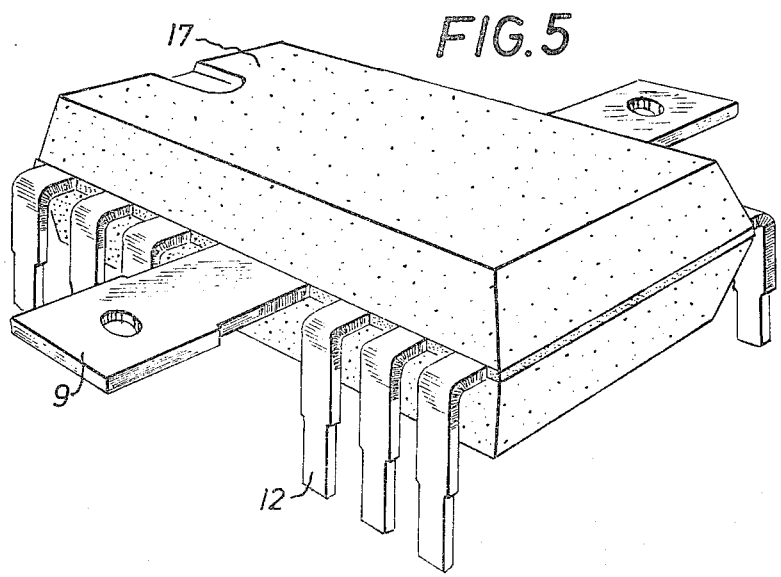

METHOD OF CONTACTING CONTACT POINTS OF A SEMICONDUCTOR BODY

BACKGROUND OF THE INVENTION

The invention relates to a method for contacting contact points of a seimconductor body, for example, of integrated circuits accommodated in a semiconductor body by means of a first contacting frame, which has a plurality of contacting tongues coming from the frame and projecting inwardly, and a second smaller contacting frame likewise with a plurality of contacting tongues projecting inwardly.

Hitherto a method is known in which the semiconductor body is placed on a tongue of the contacting strip. According to this the connection electrodes with a semiconductor body are connected by means of thin wire to further tongues of the contacting strip in an electrically conductive manner. The connections are produced by means of the known thermocompression method. This method has the disadvantage that practically all the connection points have to be produced manually and sequentially.

Further a contacting method is known in which the electrodes of a semiconductor body are first connected in a wirefree manner to the free end of the tongues projecting into the interior of a contacting frame. In accordance with this, the first contacting frame is so adjusted on a second, larger contacting frame that the ends of the tongues of the first contacting frame facing the frame, can be connected in an electrically conductive manner to the free ends of the tongues of the second contacting frame. The frame parts, surrounding the tongues, of the first frame must then still be severed. After embedding the semiconductor body and the connection points in a housing, the frame parts of the second contacting frame are so separated that connection lines insulated from each other and projecting into the housing interior remain. This known method has the substantial disadvantage that the heat produced in the semiconductor body is dispersed only extremely badly. Components with high power can therefore not be contacted in this way.

SUMMARY OF THE INVENTION

It is an object of the invention to provide a contacting method by means of which integrated semiconductor circuits can be contacted rapidly and simply and in the sequence of which the leakage power produced in the semiconductor body can be rapidly dispersed.

According to a first aspect of the invention, there is provided a method for contacting contact points of a semiconductor body comprising the steps of attaching said semiconductor body to a heat conducting portion of a first frame, with inwardly projecting tongues of said first frame directed towards said contact points on said semiconductor body, positioning a second frame having inwardly projecting tongues with the ends of these said tongues in engagement with said contact points of said semiconductor body with other portions of said second frame in engagement with said fingers of said first frame, attaching said second frame by its engaging parts to said semiconductor body and to said first frame, separating said second frame to separate said tongues of said second frame and render them extensions of said tongues of said first frame and separating said first frame to separate said tongues of said first frame to provide insulated lines to said contact points of said semiconductor body.

According to a second aspect of the invention, there is provided a method of contacting integrated circuits accommodated in a semiconductor body by means of a first contacting frame which has a plurality of contacting tongues starting from said frame and projecting inwardly and of a second smaller contacting frame likewise with a plurality of contacting tongues projecting inwardly, characterized in that said semiconductor body is secured with its rear side to a carrier part arranged centrally in said first contacting frame, in that thereafter said second frame is so adjusted to said semiconductor body that the free ends of the tongues of said second frame can be connected to the connection electrodes of said semiconductor body and the frame itself or parts of the tongues, abutting at the frame, can be connected to the free ends of said contacting tongues of said first frame, in that after producing all the connection points of the second frame, said second frame is so separated that said tongues of said first frame are separated from each other at their free ends, in that said semiconductor body and said connection points are surrounded by a housing, and in that subsequently said first frame is so separated that said tongues of said first frame form connection lines to the integrated semiconductor circuit, which connection lines are insulated from each other and lead into the interior of said housing.

BRIEF DESCRIPTION OF THE DRAWINGS

The invention will now be described in greater detail, by way of example, with reference to the drawings, in which:

FIG. 1 is a perspective view of a second frame formed in a metal strip, suitable for use with the method of the invention, FIG. 2 is a perspective view of a first frame suitable for use with the second frame of FIG. 1 and showing a semiconductor body attached thereto.

FIG. 5 is a perspective view of the completed semiconductor arrangement.

DESCRIPTION OF THE PREFERRED EMBODIMENT

Figure 3:
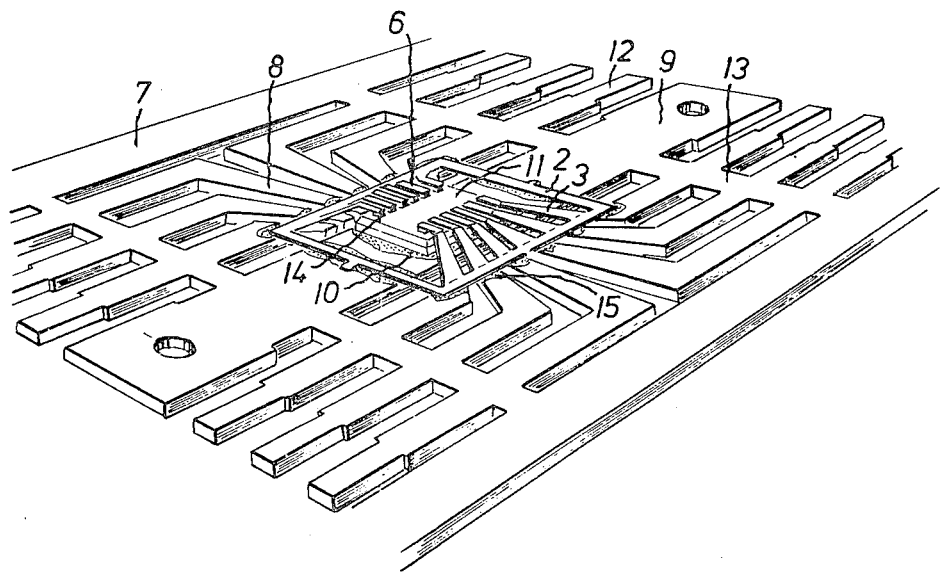
FIG. 3 is a perspective view of the first frame of FIG. 2 with the second frame of FIG. 1 attached to the first frame and to the semiconductor body.

Basically, the invention proposes, in a preferred form, in the case of a method of the type described at the outset, that the semiconductor body is secured with its rear side on a carrier part arranged centrally in the first contacting frame, in that thereafter the second frame is so adjusted to the semiconductor body that the free ends of the tongues of this frame can be connected to the connection electrodes of the semiconductor body and the frame itself or parts abutting at the frame of the tongues, can be connected to the free ends of the contacting tongues of the first frame, that after producing all the connection points, the second frame is so opened that the tongues of the first frame are separated from each other at their free ends, that the semiconductor body and the said connection points are surrounded by a housing, and that finally the first frame is so opened that the tongues of this frame form connection lines, insulated from each other and leading into the housing interior, to the integrated semiconductor circuit.

This method has the important advantage that the carrier part for the semiconductor body can be so constructed in the first contacting frame that the heat resulting in the semiconductor body can be rapidly dispersed through this carrier part. The carrier part is, for example, a wide web running in the interior of the first frame, which web connects together two side parts of this frame which lie opposite each other.

The contacting frames and the tongues are preferably arranged one after the other in a large number and are etched into or stamped into a continuous metal strip. Both contacting frames are preferably tinned. The connection points between the electrodes of the semiconductor body and the tongues of the second frame, as well as between the second frame and the tongues of the first frame can be produced by soldering in any suitable sequence.

A further important advantage of the method in accordance with the invention consists in that the second frame does not have to be adjusted quite exactly to the first frame, but a faulty adjustment by half a tongue width can be put up with. The contacting tongues of the second frame are preferably so preembossed that the height difference between the connection electrodes of the semiconductor body and the tongues of the first frame is equalized by the form of the embossing. As a result of this pre-embossing, mechanical damage by temperature dependent expansion is avoided, since this expansion can be equalized by the embossing curvature.

Referring now to the drawings, FIG. 1 shows the second contacting frame. This frame was etched into a metal strip which comprises for example a copper foil of between 35 to 50 μm thick. The contacting frame 2 has tongues 3 projecting into the interior, the free ends 6 of which tongues are provided for the wire-free connection to the electrodes of a semiconductor body. The frame 2 is connected by narrow webs 4 to outer side webs of the metal strip 1 and transverse webs 5. As a result of the extensive free etching of the frame, this frame can be very easily taken out of the carrier foil 1. In the case of the production stage shown in FIG. 1, the connection tongues 3 are already so provided with an embossed curvature by an embossing operation that the ends 6 project above the surface formed by the frame 2. The frame 2 and the associated tongues 3 are preferably tinned before or after the embossing.

FIG. 2 shows the larger or first contacting frame 7, which was etched into or stamped into, for example, a copper strip which is approximately 250 μm thick. This frame also has connection tongues 8 projecting inwards which continue outside the frame in the connection tongues 12. A carrier part 9 runs parallel or perpendicular to the direction of the contacting tongues through the interior of the frame 7, which carrier part connects together the two side parts 13 of the frame lying opposite each other to each other and even projects beyond the side parts. The carrier part 9 is constructed to be relatively broad so that the heat arising in the semiconductor body is eliminated well. The frame 7, the tongues 8 and the carrier 9 are completely or partially tinned (10). After this the semiconductor body 11 is soldered onto the carrier part 9 with its rear face with the help of the tinning (10). The connection electrodes 14, mostly comprising gold, of the semiconductor body can be seen on the front face of the semiconductor body. The tongues 8 projecting into the interior of the frame are so formed that the free ends of these tongues terminate as far as possible in the immediate vicinity of the associated connection electrodes of the semiconductor body.

The webs 4 in FIG. 1 are now separated and the second frame 2 is taken out of its carrier strip and adjusted, in the manner shown in FIG. 3, to the electrodes of the semiconductor body. In this case the free ends 6 of the tongues 3 come into contact with the electrodes 14, whereas the frame 2 runs perpendicularly to the free ends of the tongues 8 in the first frame. After the adjustment, a stamp, for example, is placed on the frame 2 and the tongue ends 6, which stamp is so heated that both the tongue ends 6 are firmly connected to the electrodes 14 and the frame 2 to the tongues 8. It is also possible that the connection points at the semiconductor electrodes or at the ends of the tongues 8 are produced one after the other in any sequence. Since both frames are already tinned, this tinning at the points 15 serves as connecting material between the frame parts.

Figure 4:
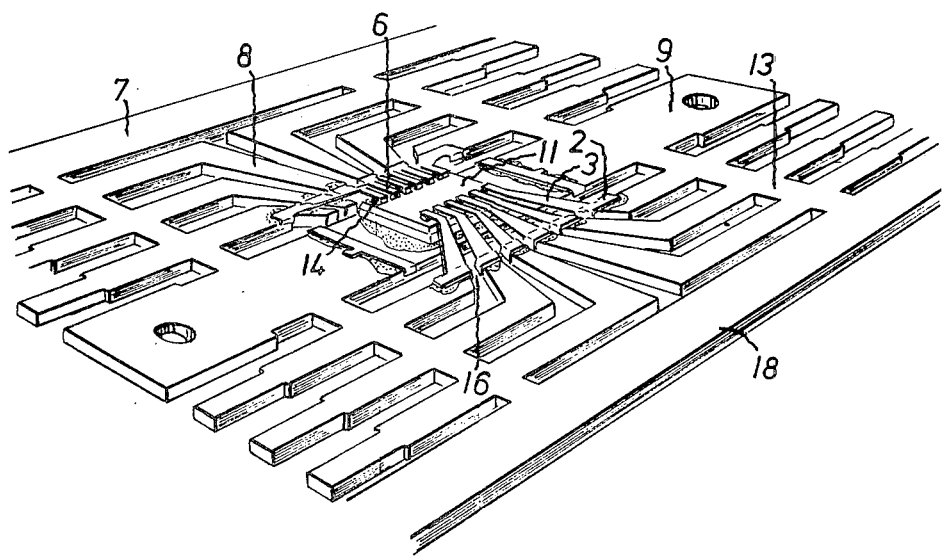
FIG. 4 is a view similar to FIG. 3 but showing separation of the second frame.

In accordance with FIG. 4 the frame 2 is separated at the parts bridging the tongues 8. This is effected with a knife, shears or a chisel. For example if a cutting chisel is used, then the parts, projecting over the tongues, of the frame 2 are simultaneously bent downwardly during the cutting free process so that no short circuits between the individual tongues are possible.

Finally, in accordance with the invention, the semiconductor body and the connection points are cast into a plastic housing 17. After this the parts of the connecting web 13 (FIG. 4) remaining between the tongues 8, as well as the outer side webs 18 have to be cut off. The connection lines 12 can be bent round after this, still according to FIG. 5, and thus form a plug-in type circuit connection. The ends of the carrier part 9, projecting out of the housing, are the cooling fins of the integrated semiconductor circuit and can be connected to further cooling surfaces.

An advantage of the method in accordance with the invention also consists in the fact that gold plated contacting frames are not required by only tinned contacting frames are used. In this way the costs of the metal strips can be reduced considerably. The width of the second frame is approximately 0.5 cm, whereas the width of the first frame is, for example, of the order of magnitude of 2 cm. The tongues of the second frame, are, for example, only 0.2 mm wide.

It will be understood that the above description of the present invention is susceptible to various modifications, changes and adaptations.

What is claimed is:

1. A method for contacting integrated circuits accommodated in a semiconductor body by means of a first contacting frame which has a plurality of contacting tongues starting from said frame and projecting inwardly and of a second smaller contacting frame, likewise with a plurality of contacting tongues projecting inwardly, comprising: securing said semiconductor body with its rear side to a carrier part arranged centrally in said first contacting frame; thereafter aligning said second frame relative to said semiconductor body so that the free ends of the tongues of said second frame can be connected to the connection electrodes of said semiconductor body and the frame itself, or parts of the tongues abutting at the frame, can be connected to the free ends of said contacting tongues of said first frame; producing all the connection points of the second frame and its tongues to the tongues of said first frame and said connection electrodes; thereafter separating said second frame by cutting the portions thereof extending between the tongues of said first frame so that said tongues of said first frame are separated from each other at their said free ends; surrounding said semiconductor body and said connection points by a housing; and subsequently separating said first frame so that said tongues of said first frame form connection lines to the integrated semiconductor circuit, which connection lines are insulated from each other and lead into the interior of said housing.

2. A method as defined in claim 1, wherein said contacting frames with said tongues are etched in a large number in a continuous metal strip.

3. A method as defined in claim 1, wherein said second contacting frame is so etched into a metal strip that said frame remains connected only by narrow webs with outer side and transverse webs of said metal strip.

4. A method as defined in claim 1, wherein said contacting tongues of said second frame are so pre-embossed that, as a result of their course, the height difference between the connection electrodes of said semiconductor body and said tongues of said first frame is equalized.

5. A method as defined in claim 1, wherein the carrier part accommodating said semiconductor body is so constructed that heat resulting in said semiconductor body can be rapidly dispersed through said carrier part.

6. A method as defined in claim 5, wherein said carrier part is centrally disposed in the interior of said first frame and connects together two side parts of said first frame which lie opposite each other.

7. A method as defined in claim 1, wherein after producing all the connection points in any sequence, said step of separating said second frame further includes, after cutting the parts of said second frame extending between said tongues of said first frame, bending the parts of said second frame projecting over the edges of said tongues of said first frame around the adjacent side of the associated tongue of said first frame.

8. A method as defined in claim 1, wherein said contacting frames and their tongues are tinned, and wherein said step of producing all of the connection points comprises soldering the second frame and its tongues to the tongues of said first frame and said connection electrodes respectively.

9. A method as defined in claim 1, wherein said housing is formed by casting plastics around or spraying plastics onto said semiconductor body and said connection points.

10. A method for contacting contact points of a semiconductor body comprising the steps of: attaching said semiconductor body to a heat conducting portion of a first frame having inwardly projecting tongues directed towards said contact points on said semiconductor body, positioning a second frame, having a closed outer portion and a plurality of inwardly projecting tongues, with the ends of these said tongues in engagement with said contact points of said semiconductor body and with at least said closed outer portions of said second frame in engagement with said tongues of said first frame, attaching said second frame by its engaging parts to said semiconductor body and to said first frame, cutting said outer portion of said second frame at positions between said tongues of said first frame to separate said tongues of said second frame, and render them extensions of said tongues of said first frame, and separating said first frame to separate said tongues of said first frame to provide insulated lines to said contact points of said semiconductor body.

11. A method as defined in claim 10, and comprising, after separating said second frame embedding said semiconductor body, said second frame and part of said first frame in a housing prior to separating said second frame.

* * * * *

UNITED STATES PATENT AND TRADEMARK OFFICE
CERTIFICATE OF CORRECTION

PATENT NO. : 3,967,366
DATED : July 6th, 1976
INVENTOR(S) : Georg Birglechner et al It is certified that error appears in the above-identified patent and that said Letters Patent are hereby corrected as shown below:

In the heading of the patent, change the second inventor's first name from "Leonard" to --Leonhard--;

Column 4, line 43, change "by" to --but--.

Signed and Sealed this

Fourth Day of January 1977

[SEAL]

Attest:

RUTH C. MASON
*Attesting Officer*

C. MARSHALL DANN
*Commissioner of Patents and Trademarks*